(12) United States Patent
Paik

(10) Patent No.: US 11,532,375 B2
(45) Date of Patent: Dec. 20, 2022

(54) LATCH CIRCUIT AND MEMORY DEVICE INCLUDING THE SAME

(71) Applicant: SK hynix Inc., Gyeonggi-do (KR)

(72) Inventor: Woo Hyun Paik, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/198,659

(22) Filed: Mar. 11, 2021

(65) Prior Publication Data

US 2022/0068428 A1    Mar. 3, 2022

(30) Foreign Application Priority Data

Aug. 31, 2020  (KR) .................. 10-2020-0110103

(51) Int. Cl.

| | | |
|---|---|---|
| G11C 11/40 | (2006.01) | |
| G11C 29/44 | (2006.01) | |
| G11C 29/42 | (2006.01) | |
| G11C 29/20 | (2006.01) | |
| G11C 11/406 | (2006.01) | |
| G11C 29/00 | (2006.01) | |
| G11C 29/10 | (2006.01) | |

(52) U.S. Cl.
CPC ........ *G11C 29/44* (2013.01); *G11C 11/40615* (2013.01); *G11C 11/40622* (2013.01); *G11C 29/10* (2013.01); *G11C 29/20* (2013.01); *G11C 29/42* (2013.01); *G11C 29/76* (2013.01)

(58) Field of Classification Search
CPC .............. G11C 29/44; G11C 11/40615; G11C 11/40622; G11C 29/10; G11C 29/20; G11C 29/42; G11C 29/76; G11C 16/3418; G11C 29/789; G11C 29/18; G11C 29/787; G11C 29/808
See application file for complete search history.

(56) References Cited

U.S. PATENT DOCUMENTS

| | | | | |
|---|---|---|---|---|
| 2003/0169634 A1* | 9/2003 | Kilmer | .................. | G11C 11/406 365/222 |
| 2011/0292710 A1* | 12/2011 | Matsubayashi | ....... | G11C 11/406 365/94 |
| 2013/0282973 A1* | 10/2013 | Kim | ...................... | G11C 11/408 711/106 |

FOREIGN PATENT DOCUMENTS

| | | |
|---|---|---|
| KR | 10-2017-0112786 | 10/2017 |
| KR | 10-2018-0022140 | 3/2018 |

* cited by examiner

*Primary Examiner* — Mohammed A Bashar
(74) *Attorney, Agent, or Firm* — IP & T Group LLP

(57) ABSTRACT

A memory device includes a latch circuit suitable for storing an input address as a first latch address in response to a first latch signal, and storing an address, selected between the input address and the first latch address, as a second latch address in response to a second latch signal, a test determining circuit suitable for determining whether a memory cell fail occurs, based on test data, and generating a detection signal corresponding to the determination result, in response to a test mode signal, and a control signal generation circuit suitable for comparing the input address to the first and second latch addresses in response to the detection signal, and selectively enabling the first and second latch signals according to the comparison result.

21 Claims, 4 Drawing Sheets

LATCH CIRCUIT AND MEMORY DEVICE INCLUDING THE SAME

CROSS-REFERENCE TO RELATED APPLICATION

This application claims priority under 35 U.S.C. § 119 to Korean Patent Application No. 10-2020-0110103, filed on Aug. 31, 2020, which is incorporated herein by reference in its entirety.

BACKGROUND

1. Field

Various embodiments relate to a memory device including a latch circuit configured to store the address of a memory cell or specific information.

2. Discussion of the Related Art

A memory device includes a plurality of memory cells arranged in a matrix shape within a memory cell array. As the capacity of the memory device is increased while process technology is scaled down, the possibility that a fail will occur in one or more memory cells is increasing. That is, as tens of millions of memory cells are integrated in one chip, the possibility that a memory cell will fail is further increasing despite the development of the fabrication process. Even one failed memory cell among many may render the memory device inoperable, and thus defective, in which case the device has to be discarded.

Therefore, in order to improve the yield of the memory device lot as well as to improve integration density and speed of each of the devices, technology for efficiently repairing failed memory cell(s) is used. One method for repairing failed memory cells in a memory device is to use redundancy memory cells to replace failed memory cells.

For this method, the memory device includes a fuse circuit which can detect the address of a failed memory cell, i.e., a repair address, and program the detected address. A fuse included in the fuse circuit stores an address or specific information through a fuse programming operation. When laser beam or electrical stress is applied to the fuse, the electrical resistance value of the fuse is changed while the electrical coupling characteristic of the fuse is changed. Through such a change in electrical coupling state of the fuse—short or open state, the address or specific information is programmed.

For reference, a laser blowing-type fuse which removes the coupling state of the fuse using a laser beam is generally referred to as a physical fuse type. Typically, the laser blowing-type fuse is programmed at a wafer level before the memory device is fabricated as a package. At the package level of the memory device, an electrical fuse type is used instead of the physical fuse type which uses laser. Such an electrical fuse type may include an anti-type fuse which applies electrical stress to change the electrical coupling state of the fuse from the open state to the short state. In this way, various types of fuses are selectively used in consideration of the characteristic or area of the memory device.

SUMMARY

Various embodiments are directed to a memory device capable of sharing a latch circuit for storing the address of a memory cell or specific information, and thus increasing the number of addresses or the amount of information, which can be stored therein, without an increase in area.

In an embodiment, a memory device may include a latch circuit suitable for storing an input address as a first latch address in response to a first latch signal, and storing an address, selected between the input address and the first latch address, as a second latch address in response to a second latch signal; a test determining circuit suitable for determining whether a memory cell fail occurs, based on test data, and generating a detection signal corresponding to the determination result, in response to a test mode signal; and a control signal generation circuit suitable for comparing the input address to the first and second latch addresses in response to the detection signal, and selectively enabling the first and second latch signals according to the comparison result.

In an embodiment, a memory device may include a refresh control circuit suitable for generating an input signal and an output signal according to a target refresh operation; a test determining circuit suitable for determining whether a memory cell fail occurs, based on test data, and generating a detection signal based on the determination, in response to a test mode signal; and a control signal generation circuit suitable for, while transmitting the input signal and the output signal as a first latch signal and a second latch signal, respectively, comparing an input address to a first latch address and a second latch address when the detection signal is enabled, and selectively enabling the first and second latch signals according to the comparison result.

In an embodiment, a memory device may include a memory cell array including a plurality of memory cells; a test determining circuit suitable for determining whether a fail of one or more memory cells among the plurality of memory cells occurs and generating a detection signal corresponding to the determination result, in response to enabling of a test mode signal; a refresh control circuit suitable for generating input and output signals associated with a target refresh operation; a control signal generation circuit suitable for receiving an input address and the input and output signals, in response to disabling of the test mode signal, generating the input and output signals as first and second latch signals, respectively, and in response to enabling of the test mode signal, comparing the input address with first and second latch addresses in response to the detection signal, and selectively enabling one of the first and second latch signals according to the comparison result; and a latch circuit suitable for receiving the input signal, storing the input address as the first latch address in response to the first latch signal, and storing an address, selected from the input address and the first latch address, as the second latch address in response to the second latch signal.

In accordance with the present embodiment, the latch circuits which are used for different purposes of use may be shared in the memory device. For example, a repair address detected during a test operation may be stored in the latch circuits, and then programmed to the fuse circuit through a rupture operation. Therefore, as such latch circuits are shared during a normal operation, it is possible to reduce the number and area of the latch circuits included in the memory device. The memory device may differently generate control signals of the latch circuits depending on operation modes, and store a relatively large amount of information in the latch circuits, without an increase in area.

DETAILED DESCRIPTION

Various embodiments are described in detail below with reference to the accompanying drawings. The following description focuses on features and aspects of the present invention; well-known material may be omitted so as not to obscure the subject matter of the present invention. Throughout the specification, reference to "an embodiment" or the like is not necessarily to only one embodiment, and different references to any phrase are not necessarily to the same embodiments. The term "embodiments" does not necessarily refer to all embodiments.

Figure 1:
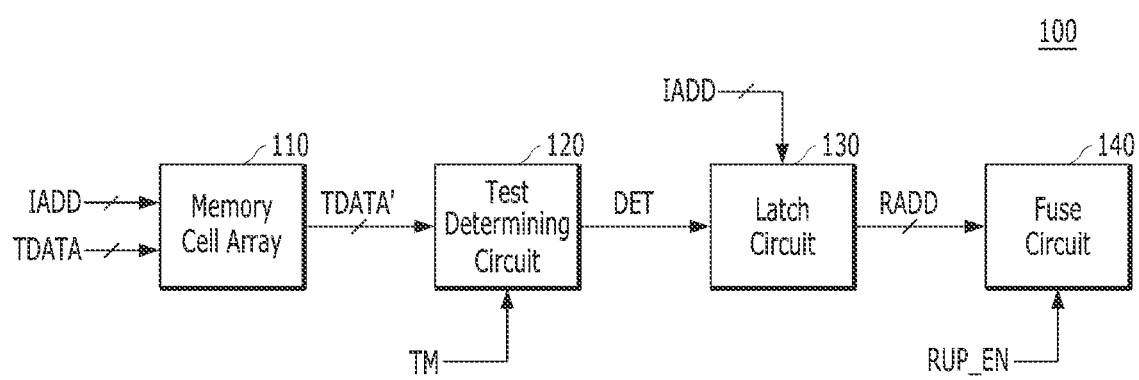
FIG. 1 is a block diagram illustrating a memory device which detects a repair address and performs fuse programming.

FIG. 1 is a block diagram illustrating a memory device 100 which detects a repair address and performs fuse programming. Referring to FIG. 1, the memory device 100 may include a memory cell array 110, a test determining circuit 120, a latch circuit 130 and a fuse circuit 140.

The memory device 100 may detect a failed memory cell among a plurality of memory cells included in the memory cell array 110 through a test operation. The memory device 100 may store an address of the detected failed memory cell, i.e., a repair address, in the latch circuit 130, and program the stored repair address to the fuse circuit 140 through a rupture operation. Such series of operations of the memory device 100 may be referred to as a self-rupture operation.

In a test mode for the self-rupture operation, a test mode signal TM may be enabled. The test mode signal TM may be output from a mode register set of the memory device 100. The test mode signal TM may be input to the memory device 100 from an external device.

When the test mode signal TM is enabled, the memory device 100 may perform a test operation for detecting a repair address. That is, the memory device 100 may write data TDATA having the same logic level to memory cells corresponding to input addresses IADD, among a plurality of memory cells of the memory cell array 110. The memory device 100 may reread the written data, and transmit the reread data as test data TDATA'.

In response to the test mode signal TM, the test determining circuit 120 may determine whether the memory cells corresponding to the input addresses IADD are failed memory cells, based on the test data TDATA', and generate a detection signal DET. When the test mode signal TM is enabled, the test determining circuit 120 may output the detection signal DET by combing the test data TDATA'. For example, the test determining circuit 120 may include a logic gate configured to perform a logic operation (e.g., an XOR operation) on the test data TDATA', and output the detection signal DET.

Since the data TDATA having the same logic level have been written to the memory cells and reread, the test data TDATA' may also have the same logic level when the memory cells are normally operated. However, when the logic levels of the test data TDATA' are different from each other, the test determining circuit 120 may determine the memory cells corresponding to the input addresses IADD as failed memory cells, and enable the detection signal DET.

The latch circuit 130 may store the input addresses IADD in response to the detection signal DET. The input addresses IADD may include bank and row addresses of the memory cells from which the test data TDATA' are read. Therefore, when the detection signal DET is enabled, the memory cells from which the test data TDATA' are read may be determined to be failed memory cells, and the latch circuit 130 may store the input addresses IADD.

When a rupture enable signal RUP_EN is enabled, the fuse circuit 140 may electrically program a repair address RADD stored in the latch circuit 130. The fuse circuit 140 may include a plurality of anti-fuse sets. When the rupture enable signal RUP_EN is enabled, a programming operation may be performed to change the electrical coupling state by applying an over-current or high voltage to the anti-fuse sets included in the fuse circuit 140.

In some embodiments, one or more latch circuits 130 for storing the repair address RADD may be installed in a designated area of the memory device 100, and the number of the latch circuits 130 may be limited. Therefore, the number of the latch circuits 130 that may be installed is limited. However, by employing mufti-purpose latch circuits that can be used for other operations in addition to the self-rupture operation, enough latch circuits may be installed to cover all repair addresses RADD of the failed memory cells. Thus, when the latch circuits are shared, an increased number of failed memory cells can be repaired without increasing the area of the memory device 100.

Figure 2:
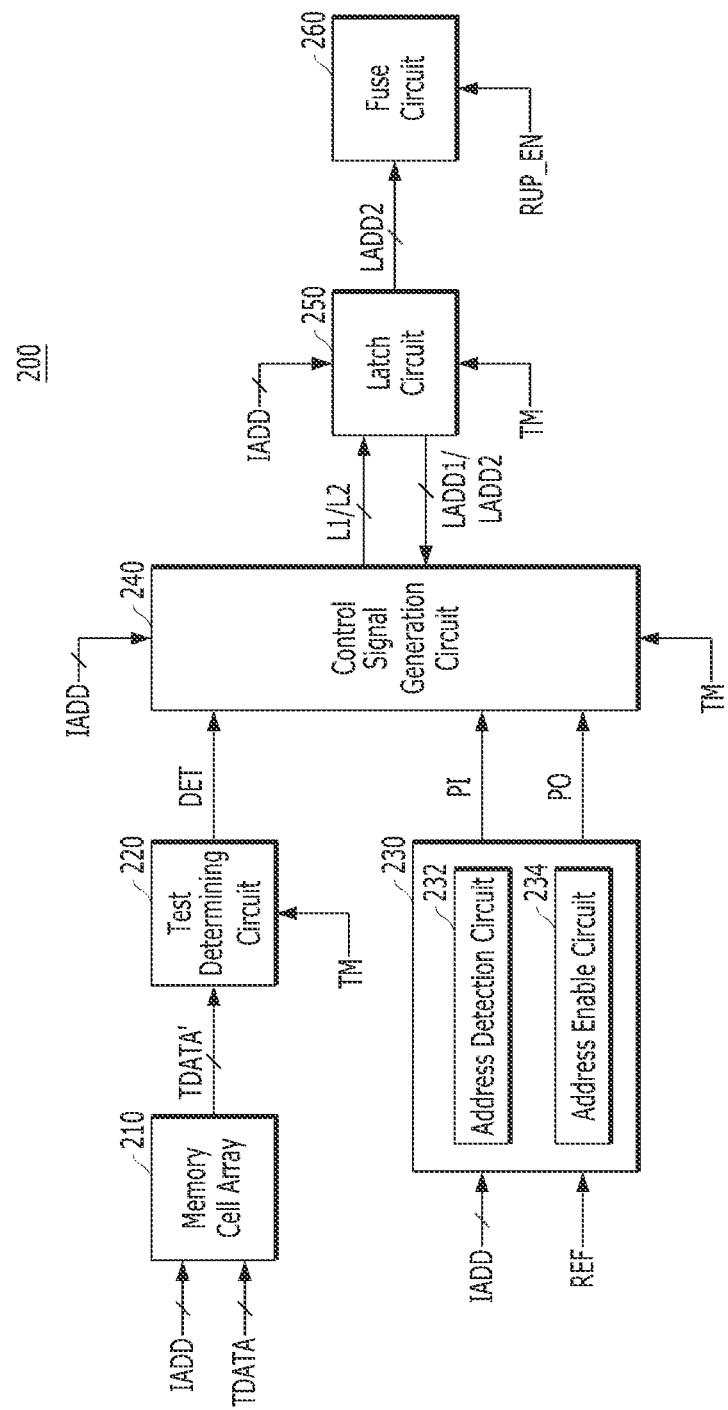
FIG. 2 is a block diagram illustrating a memory device in accordance with an embodiment.

FIG. 2 is a block diagram illustrating a memory device 200 in accordance with an embodiment. Referring to FIG. 2, the memory device 200 may include a memory cell array 210, a test determining circuit 220, a refresh control circuit 230, a control signal generation circuit 240, a latch circuit 250 and a fuse circuit 260.

The memory cell array 210 and the test determining circuit 220 may operate in a similar manner to the memory cell array 110 and the test determining circuit 120 of FIG. 1, respectively. That is, when a test mode signal TM is enabled, data TDATA having the same logic level may be written to memory cells corresponding to input addresses IADD among a plurality of memory cells of the memory cell array 210, and then read as test data TDATA'. When the test mode signal TM is enabled, the test determining circuit 220 may generate a detection signal DET based on the test data TDATA'.

In some embodiments, the memory device 200 may perform a refresh operation, Since the memory cells in the memory cell array 210 store data in such a manner that charges are accumulated therein, the data stored in the memory cells may be lost after a set data retention time. Therefore, the memory device 200 may perform a refresh operation of periodically reading the data of the memory cells, and rewriting the read data.

The memory device 200 may perform a target refresh operation with the periodic refresh operations. That is, the memory device 200 may detect a deteriorated memory cell among the memory cells included in the memory cell array 210, and perform an additional target refresh operation on the detected memory cell. For example, when a specific word line of the memory cell array 210 is frequently activated, data of memory cells coupled to a word line adjacent to the corresponding word line may be affected. Therefore, the memory device 200 may detect the frequently activated word line, i.e., a row hammered word line, and perform the target refresh operation on the detected word line.

As the memory device 200 performs the target refresh operation, the refresh control circuit 230 may detect a target address for the target refresh operation. The refresh control circuit 230 may generate an input signal PI and an output signal PO for storing and outputting the detected target address. In some embodiments, the target address may include a row address indicating the row hammered word line or a word line adjacent thereto. Hereafter, the case in which the target address is the row address of the row hammered word line is described as an example.

Referring to FIG. 2, the refresh control circuit 230 may include an address detection circuit 232 and an address enable circuit 234. The address detection circuit 232 may count the number of same addresses among the input addresses IADD. When the count is greater than or equal to a set count, the address detection circuit 232 may enable the input signal PI. In some embodiments, the input addresses IADD may include a row address which is activated according to a write/read operation of the memory device 200. Therefore, the address detection circuit 232 may detect a row address, which has been activated a set number of times or more, as the target address, and generate the input signal PI for storing the detected row address.

In response to a refresh signal REF which is enabled during the target refresh operation, the address enable circuit 234 may enable the output signal PO. Therefore, when the memory device 200 performs the target refresh operation, the address enable circuit 234 may generate the output signal PO for outputting the stored target address.

The control signal generation circuit 240 may transmit the input signal PI and the output signal PO as first and second latch signals L1 and L2, respectively. Further, the control signal generation circuit 240 may compare the input addresses IADD to the first and second latch addresses LADD1 and LADD2 when the detection signal DET is enabled. Furthermore, the control signal generation circuit 240 may selectively enable the first and second latch signals L1 and L2 according to the comparison result. The configuration of the control signal generation circuit 240 will be described in more detail with reference to FIG. 3.

The latch circuit 250 may store the input address IADD as the first latch address LADD1 in response to the first latch signal L1, Further, the latch circuit 250 may store an address, selected among the input addresses IADD and the first latch address LADD1, as the second latch address LADD2 in response to the second latch signal L2. In some embodiments, the latch circuit 250 may select the input address IADD when the test mode signal TM is enabled, and select the first latch address LADD1 when the test mode signal TM is disabled.

When the rupture enable signal RUP_EN is enabled, the fuse circuit 260 may electrically program the second latch address LADD2 stored in the latch circuit 250. The fuse circuit 260 may include a plurality of anti-fuse sets. When the rupture enable signal RUP_EN is enabled, a program operation may be performed to change the electrical coupling state by applying an over-current or high voltage to the anti-fuse sets in the fuse circuit 260.

Figure 3:
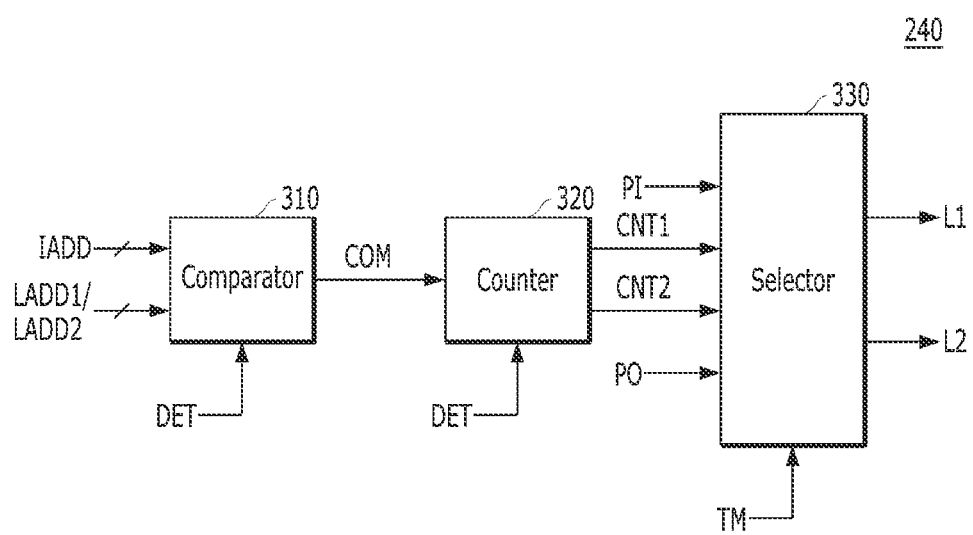
FIG. 3 is a block diagram illustrating a control signal generation circuit, such as that illustrated in FIG. 2.

FIG. 3 is a block diagram illustrating the control signal generation circuit 240 illustrated in FIG. 2. Referring to FIG. 3, the control signal generation circuit 240 may include a comparator 310, a counter 320 and a selector 330.

The comparator 310 may compare an input address IADD to each of the first and second latch addresses LADD1 and LADD2 when the detection signal DET is enabled, and generate a comparison signal COM according to the comparison result. When the input address IADD is equal to any one of the first and second latch addresses LADD1 and LADD2, the comparator 310 may enable the comparison signal COM.

The counter 320 may count pukes or cycles of the detection signal DET in response to the comparison signal COM, and generate first and second counting signals CNT1 and CNT2 corresponding to the count. When the comparison signal COM is disabled, the counter 320 may increase the count whenever the detection signal DET is enabled, and sequentially generate the first and second counting signals CNT1 and CNT2 corresponding to the increased count. When the comparison signal COM is enabled, the counter 320 may disable the first and second counting signals CNT1 and CNT2 regardless of whether the detection signal DET is enabled.

In response to the test mode signal TM, the selector 330 may select the input signal PI and the first counting signal CNT1 and output the selected signals as the first latch signal L1, and select the output signal PO and the second counting signal CNT2 and output the selected signals as the second latch signal L2. That is, when the test mode signal TM is enabled, the selector 330 may output the first and second counting signals CNT1 and CNT2 as the first and second latch signals L1 and L2, respectively. On the other hand, when the test mode signal TM is disabled, the selector 330 may output the input signal PT and the output signal PO as the first and second latch signals L1 and L2, respectively.

Figure 4:
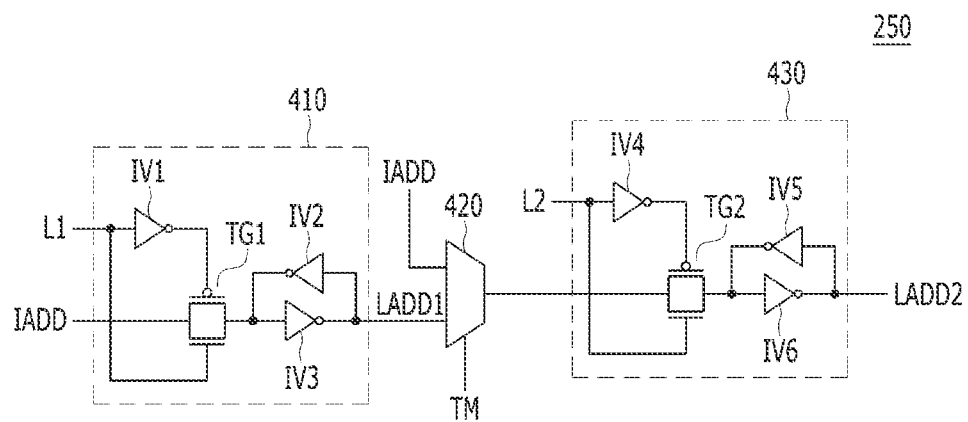
FIG. 4 is a circuit diagram illustrating a latch circuit, such as that of FIG. 2.

FIG. 4 is a circuit diagram illustrating the latch circuit 250 of FIG. 2. Referring to FIG. 4, the latch circuit 250 may include a first latch 410, a selector 420 and a second latch 430.

The first latch 410 may store and output the input address IADD as the first latch address LADD1 in response to the first latch signal L1. For this operation, the first latch 410 may include a first transmission gate TG1 and first to third inverters IV1 to IV3. The first transmission gate TG1 may transmit the input address IADD in response to the first latch signal L1 and a signal obtained by inverting the first latch signal L1 through the first inverter IV1. The second and third inverters IV2 and IV3 may be coupled as a cross-coupled latch, and store and output the signal, transmitted by the first transmission gate TG1, as the first latch address LADD1.

The selector 420 may select one of the input address IADD and the first latch address LADD1 and output the selected signal, in response to the test mode signal TM. That is, when the test mode signal TM is enabled, the selector 420 may select and output the input address IADD. When the test mode signal TM is disabled, the selector 420 may select and output the first latch address LADD1.

The second latch 430 may store and output the address, selected by the selector 420, as the second latch address LADD2 in response to the second latch signal L2. For this operation, the second latch 430 may include a second transmission gate TG2 and fourth to sixth inverters IV4 to IV6. The second transmission gate TG2 may transmit the address selected by the selector 420 in response to the second latch signal L2 and a signal obtained by inverting the second latch signal L2 through the fourth inverter IV4. The fifth and sixth inverters IV5 and IV6 may be coupled as a cross-coupled latch, and store and output the signal, transmitted by the second transmission gate TG2, as the second latch address LADD2.

In some embodiments, the latch circuit 250 may store a repair address for a repair operation and a target address for a target refresh operation. That is, when a fail is detected from the test data TDATA' which are written to the memory cell array 210 and reread during a test operation, the latch circuit 250 may store the input address IADD corresponding to the repair address. As such, the address stored in the latch circuit 250 may be programmed to the fuse circuit 260 through a rupture operation. When a row address which has been activated a set number of times or more is detected during a normal operation, the latch circuit 250 may store the input address IADD corresponding to the target address. When the memory device 200 performs the target refresh operation, the latch circuit 250 may output the stored address.

For example, the memory device 200 may include one or two latch circuits 250 installed in each memory bank for the target refresh operation. When the latch circuit 250 is used to store the repair address during the test operation, two repair addresses may be stored in each of the first and second latches 410 and 430. Therefore, when the memory device 200 includes 16 memory banks, the memory device 200 may additionally store 32 to 64 repair addresses without an increase in area of the memory device 200.

Although FIG. 4 illustrates a configuration corresponding to one bit of the input address IADD, a plurality of first latches 410 and a plurality of second latches 430 may be coupled in parallel in response to a plurality of bits of the input address IADD. The latch circuit 250 may include a plurality of sets each having the components of FIG. 4 set to basic units, in order to store the plurality of input addresses IADD.

Figure 5:
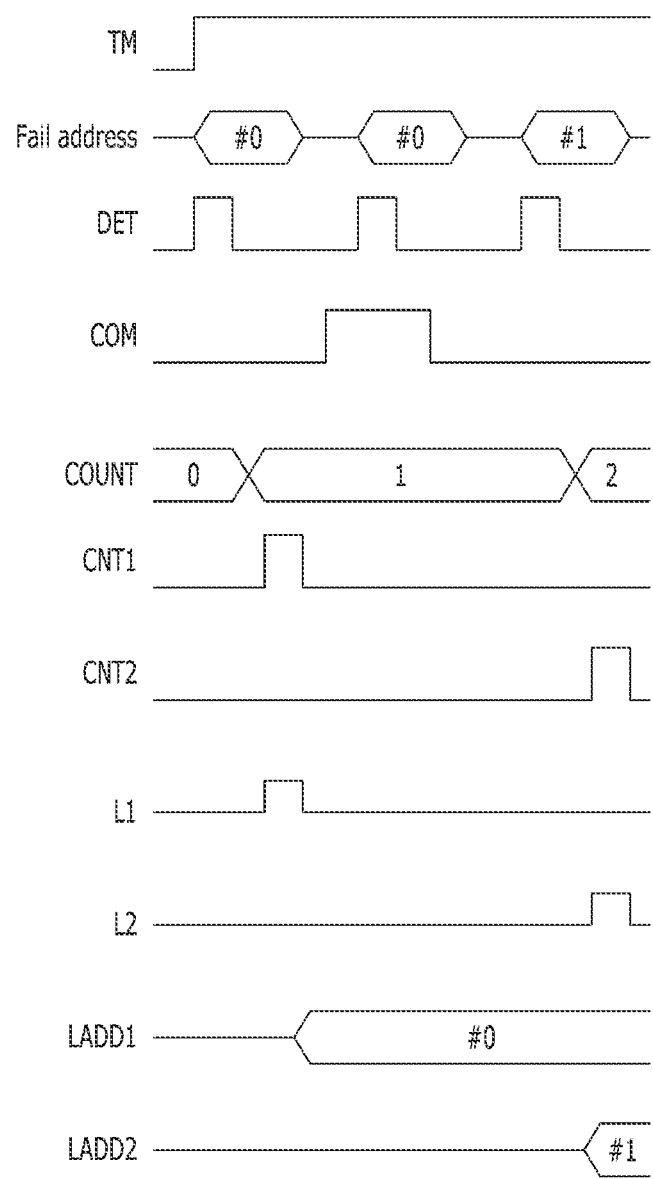
FIG. 5 is a waveform diagram illustrating an operation of a memory device in accordance with an embodiment.

FIG. 5 is a waveform diagram for describing operation of the memory device 200 in accordance with the present embodiment, FIG. 5 illustrates an example in which the input addresses IADD corresponding to (0, 0, 1) are sequentially detected as fail addresses through the test operation.

Referring to FIG. 5, first, the test mode signal TM may be enabled, and the memory device 200 may perform the test operation. The test determining circuit 220 may receive the test data TDATA', and enable the detection signal DET indicating a first fail address of 0 based on the test data TATA'. When the detection signal DET is enabled, the control signal generation circuit 240 may compare the fail address of 0 to the first and second latch addresses LADD1 and LADD2 regardless of the input signal PT and the output signal PO, and selectively enable the first and second latch signals L1 and L2 according to the comparison result.

Specifically, the comparator 310 of the control signal generation circuit 240 may compare the fail address of 0 to each of the first and second latch addresses LADD1 and LADD2. Since the fail address of 0 is first detected and the latch circuit 250 does not store a specific address, the comparator 310 may disable the comparison signal COM.

Therefore, the counter 320 of the control signal generation circuit 240 may increase a count COUTN (0→1) by counting the enabled detection signal DET, and enable the first counting signal CNT1. Since the test mode signal TM has been enabled, the selector 330 of the control signal generation circuit 240 may output the first counting signal CNT1 as the first latch signal L1. The first latch 410 of the latch circuit 250 may store the fail address of 0 as the first latch address LADD1 in response to the first latch signal L1.

Then, as the second fail address of 0 is detected again, the test determining circuit 220 may enable the detection signal DET. When the detection signal DET is enabled, the comparator 310 may compare the fail address of 0 to each of the first and second latch addresses LADD1 and LADD2. Since the latch circuit 250 stores the first detected fail address of 0 as the first latch address LADD1, the comparator 310 may enable the comparison signal COM.

When the comparison signal COM is enabled, the counter 320 may retain the count COUNT, and disable the first and second counting signals CNT1 and CNT2. The selector 330 may also disable the first and second latch signals L1 and L2, and prevent the latch circuit 250 from redundantly storing the fail address of 0, stored as the first latch address LADD1.

Finally, when a new fail address of 1 is detected, the test determining circuit 220 may enable the detection signal DET. When the detection signal DET is enabled, the comparator 310 may compare the new fail address of 1 to each of the first and second latch addresses LADD1 and LADD2. Since the new fail address of 1 is different from the fail address of 0, stored as the first latch address LADD1, the comparator 310 may disable the comparison signal COM.

When the comparison signal COM is disabled, the counter 320 may increase the count COUNT (i.e., 1→2) by counting the enabled detection signal DET, and enable the second counting signal CNT2. Therefore, the selector 330 may output the second counting signal CNT2 as the second latch signal L2. The selector 420 of the latch circuit 250 may select and transmit the fail address of 1 in response to the test mode signal TM, and the second latch 430 may store the fail address of 1 as the second latch address LADD2 in response to the second latch signal L2.

Although various embodiments have been illustrated and described, it will be apparent to those skilled in the art in view of the present disclosure that various changes and modifications may be made without departing from the spirit and scope of the invention as defined in the following claims.

What is claimed is:

1. A memory device comprising:
   a latch circuit configured to store an input address as a first latch address in response to a first latch signal, and store an address, selected between the input address and the first latch address, as a second latch address in response to a second latch signal;
   a test determining circuit configured to determine whether a memory cell fail occurs, based on test data, and generate a detection signal corresponding to the determination result, in response to a test mode signal; and
   a control signal generation circuit configured to selectively enable the first and second latch signals by comparing the input address to the first and second latch addresses in response to the detection signal.

2. The memory device of claim 1, further comprising a refresh control circuit configured to generate an input signal when a target address for a target refresh operation is detected, and generate an output signal when the memory device performs the target refresh operation.

3. The memory device of claim 2, wherein the refresh control circuit counts the number of same addresses based on the input address, and enables the input signal when the count is greater than or equal to a set count.

4. The memory device of claim 2, wherein the control signal generation circuit comprises:
   a comparator configured to generate a comparison signal by comparing the input address to the first and second latch addresses when the detection signal is enabled;
   a counter configured to count cycles of the detection signal in response to the comparison signal, and generate a first counting signal and a second counting signal which correspond to the count; and
   a selector configured to select the input signal and the first counting signal and output the selected signal as the first latch signal, select the output signal and the second counting signal, and output the selected signal as the second latch signal, in response to the test mode signal.

5. The memory device of claim 4, wherein the comparator enables the comparison signal when the input address is the same as any one of the first and second latch addresses.

6. The memory device of claim 5, wherein the counter disables the first and second counting signals when the comparison signal is enabled.

7. The memory device of claim 1, wherein the latch circuit comprises:
   a first latch configured to store the input address as the first latch address in response to the first latch signal;
   a selector configured to select and output the input address and the first latch address in response to the test mode signal; and
   a second latch configured to store the address selected by the selector as the second latch address in response to the second latch signal.

8. The memory device of claim 7, wherein each of the first and second latches comprises:
   a transmission gate configured to transmit an input signal in response to a corresponding signal between the first and second latch signals; and
   a cross-coupled latch configured to store the signal transmitted by the transmission gate.

9. The memory device of claim 1, further comprising a memory cell array including a plurality of memory cells,
   wherein when the test mode signal is enabled, data having the same logic level are written to memory cells corresponding to the input address among the plurality of memory cells, and the written data are reread and transmitted as the test data.

10. The memory device of claim 9, wherein when the logic levels of the test data are different from each other, the test determining circuit determines the memory cells corresponding to the input address as failed memory cells, and enables the detection signal.

11. The memory device of claim 1, further comprising a fuse circuit configured to electrically program the address stored in the latch circuit when an enable signal is enabled.

12. A memory device comprising:
   a refresh control circuit configured to generate an input signal and an output signal according to a target refresh operation;
   a test determining circuit configured to determine whether a memory cell fail occurs, based on test data, and generate a detection signal based on the determination, in response to a test mode signal; and
   a control signal generation circuit configured to, while transmitting the input signal and the output signal as a first latch signal and a second latch signal, respectively, selectively enable the first and second latch signals by comparing an input address to a first latch address and a second latch address when the detection signal is enabled.

13. The memory device of claim 12, further comprising a latch circuit configured to store the input address as the first latch address in response to the first latch signal, and store an address, selected between the input address and the first latch address, as the second latch address in response to the second latch signal.

14. The memory device of claim 13, wherein the latch circuit comprises:
   a first latch configured to store the input address as the first latch address in response to the first latch signal;
   a selector configured to select and output the input address and the first latch address in response to the test mode signal; and
   a second latch configured to store the address selected by the selector as the second latch address in response to the second latch signal.

15. The memory device of claim 12, wherein the refresh control circuit comprises:
   an address detection circuit configured to count the number of same addresses based on the input address, and enable the input signal when the count is greater than or equal to a set count; and
   an address enable circuit configured to enable the output signal in response to a refresh signal.

16. The memory device of claim 12, wherein the control signal generation circuit comprises:
   a comparator configured to generate a comparison signal by comparing the input address to the first and second latch addresses when the detection signal is enabled;
   a counter configured to count cycles of the detection signal in response to the comparison signal, and generate a first counting signal and a second counting signal which correspond to the count; and
   a selector configured to select the input signal and the first counting signal and output the selected signals as the first latch signal, select the output signal and the second counting signal, and output the selected signals as the second latch signal, in response to the test mode signal.

17. The memory device of claim 16, wherein the comparator enables the comparison signal when the input address is the same as any one of the first and second latch addresses.

18. The memory device of claim 17, wherein the counter disables the first and second counting signals when the comparison signal is enabled.

19. The memory device of claim 12, further comprising a memory cell array including a plurality of memory cells,
   wherein when the test mode signal is enabled, data having the same logic level are written to memory cells corresponding to the input address among the plurality of memory cells, and the written data are reread and transmitted as the test data.

20. The memory device of claim 19, wherein when the logic levels of the test data are different from each other, the test determining circuit determines the memory cells corresponding to the input address as failed memory cells, and enables the detection signal.

21. A memory device comprising:
   a memory cell array including a plurality of memory cells;
   a test determining circuit configured to determine whether a fail of one or more memory cells among the plurality of memory cells occurs and generate a detection signal corresponding to the determination result, in response to enabling of a test mode signal;
   a refresh control circuit configured to generate input and output signals associated with a target refresh operation;
   a control signal generation circuit configured to receive an input address and the input and output signals,
      in response to disabling of the test mode signal, generate the input and output signals as first and second latch signals, respectively, and
      in response to enabling of the test mode signal, selectively enable one of the first and second latch signals by comparing the input address with first and second latch addresses in response to the detection signal; and a latch circuit configured to receive the input signal, store the input address as the first latch address in response to the first latch signal, and store an address, selected from the input address and the first latch address, as the second latch address in response to the second latch signal.

\* \* \* \* \*